United States Patent
Hanson

(10) Patent No.: US 8,288,260 B1
(45) Date of Patent: Oct. 16, 2012

(54) FIELD EFFECT TRANSISTOR WITH DUAL ETCH-STOP LAYERS FOR IMPROVED POWER, PERFORMANCE AND REPRODUCIBILITY

(75) Inventor: Allen W. Hanson, Cary, NC (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 13/173,015

(22) Filed: Jun. 30, 2011

(51) Int. Cl.
*H01L 21/28* (2006.01)
*H01L 21/44* (2006.01)

(52) U.S. Cl. . 438/571; 438/570; 438/576; 257/E21.002; 257/E21.121; 257/E31.127

(58) Field of Classification Search ............. 438/22–47, 438/93, 455, 571; 257/200–432, E21.002, 257/E21.121, E31.127
See application file for complete search history.

(56) References Cited

U.S. PATENT DOCUMENTS

| | | | |
|---|---|---|---|
| 5,539,228 A | 7/1996 | Chi | 257/283 |
| 6,060,402 A | 5/2000 | Hanson | 438/745 |
| 6,255,673 B1 * | 7/2001 | Kuzuhara | 257/192 |
| 6,465,289 B1 * | 10/2002 | Streit et al. | 438/167 |
| 2009/0039453 A1 * | 2/2009 | Nakata | 257/432 |

* cited by examiner

*Primary Examiner* — Charles Garber
*Assistant Examiner* — Abdulfattah Mustapha
(74) *Attorney, Agent, or Firm* — Christopher P. Maiorana, PC

(57) ABSTRACT

A process for fabricating a semiconductor device. The process includes (a) growing an n-channel layer of gallium arsenide (GaAs) on a buffer layer, (b) growing a barrier layer on the re-channel layer, (c) epitaxially growing a first etch-stop layer on the barrier layer, (d) growing a first contact layer of wide band-gap material on the first etch-stop layer, (e) epitaxially growing a second etch-stop layer on the first contact layer, (f) growing a second contact layer on the second etch-stop layer, where the second contact layer is a highly doped material, and (g) selectively etching portions of the first contact layer, the second etch-stop layer, and the second contact layer to form a gate region.

20 Claims, 6 Drawing Sheets

FIELD EFFECT TRANSISTOR WITH DUAL ETCH-STOP LAYERS FOR IMPROVED POWER, PERFORMANCE AND REPRODUCIBILITY

FIELD OF THE INVENTION

The present invention relates to transistor fabrication generally and, more particularly, to a method and/or apparatus for implementing a field effect transistor (FET) with dual etch-stop layers for improved power performance and reproducibility.

BACKGROUND OF THE INVENTION

Gallium-arsenide (GaAs) based field-effect transistors can utilize a depletion region formed by a metal-semiconductor junction, commonly known as a Schottky junction, to modulate the conductivity of an underlying channel layer. Such devices have gained acceptance as a high performance transistor technology due to inherent physical properties of the gallium arsenide and related ternaries such as indium gallium arsenide (InGaAs). The devices are referred to by various names such as metal semiconductor field effect transistors (MESFET), high electron mobility transistors (HEMT), pseudomorphic high electron mobility transistor (pHEMT), two dimensional electron gas field effect transistors (TEGFET), and modulation doped field effect transistors (MODFET). Further details of the dynamics of charge transport in these structures can be found in Quantum Semiconductor Structures by Weisbuch, et al., 1991 by Academic Press, pages 38-55 and pages 141-154, which is incorporated herein by reference.

The basic gallium arsenide metal semiconductor field effect transistor, known as a MESFET, has the source and drain current carried via a relatively thin, highly doped, semiconductor layer, the channel. The current is controlled by the gate which forms a Schottky barrier on the semiconductor, and therefore, depending upon the applied gate voltage, depletes the semiconductor layer of electrons under the gate. Other devices such as the HEMT, pHEMT, and MODFET are based on the basic principles described above. The structure of a basic HEMT is based on the heterojunction between two dissimilar materials, AlGaAs (Aluminum Gallium Arsenide) and GaAs (Gallium Arsenide), which are well known to those of ordinary skill in the art. Ordinarily, the two dissimilar materials used for the heterojunction have the same lattice constant (i.e., spacing between the atoms).

The pseudomorphic HEMT or pHEMT is a HEMT where the two dissimilar materials used for the heterojunction do not have the same lattice constant. The formation of a heterojunction with materials of different lattice constants can be achieved by using an extremely thin layer of one of the materials—so thin that the crystal lattice simply stretches to fit the other material. This technique allows the construction of transistors with larger bandgap differences than otherwise possible, giving the transistors better performance through improved carrier confinement.

Essentially, the transistor structure consists of a semi-insulating substrate on which is first grown a buffer layer of nominally unintentionally doped GaAs. An n-doped layer of gallium arsenide, or pseudomorphic indium gallium arsenide, forms the channel for the device. An n-minus layer of $Al_xGa_{1-x}As$ is disposed on top of the channel layer to form a proper Schottky barrier with the gate metallization. The last layer is typically a GaAs contact layer which is doped highly n-type (n-plus) to facilitate the formation of ohmic contacts to the underlying channel layer. The two ohmic contacts disposed on this layer are generally referred to as the source and the drain contacts. Access resistances associated with the source and the drain contacts and the underlying semiconductor material to the intrinsic device are typically referred to as $R_s$ and $R_d$, the source and drain resistances, respectively.

Electrons in the thin n-type $Al_xGa_{1-x}As$ layer move into the undoped gallium arsenide layer, forming a depleted $Al_xGa_{1-x}As$ layer. The electrons move into the undoped gallium arsenide layer because the heterojunction created by the two dissimilar (i.e., different band-gap) materials forms a quantum well in the conduction band on the lower band-gap gallium arsenide side. The electrons are confined in the conduction band quantum well and can move laterally with relatively low resistance due primarily to a reduction in the rate of impurity scattering. This creates a very thin layer of highly mobile conducting electrons with very high concentration. The high concentration of highly mobile conducting electrons give the channel very low resistivity (also known as high electron mobility). The very thin layer of highly mobile conducting electrons is commonly called a two-dimensional electron gas (2DEG).

SUMMARY OF THE INVENTION

The present invention concerns a process for fabricating a semiconductor device. The process includes (a) growing an n-channel layer of gallium arsenide (GaAs) on a buffer layer, (b) growing a barrier layer on the n-channel layer, (c) epitaxially growing a first etch-stop layer on the barrier layer, (d) growing a first contact layer of wide band-gap material on the first etch-stop layer, (e) epitaxially growing a second etch-stop layer on the first contact layer, (f) growing a second contact layer on the second etch-stop layer, where the second contact layer is a highly doped material, and (g) selectively etching portions of the first contact layer, the second etch-stop layer, and the second contact layer to form a gate region.

The objects, features and advantages of the present invention include providing a method and/or apparatus for implementing a field effect transistor (FET) with dual etch-stop layers that may (i) provide improved power performance, (ii) provide improved reproducibility, (iii) leave behind material associated with one of the etch-stop layers, (iv) improve noise and dispersion characteristics due to low IRV, (v) reduce an amount of undercut of a second recess etch profile, and/or (vi) reduce variation of an un-gated region dimension.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

In one example, the present invention may proved a high-low-high gallium arsenide epitaxial field effect transistor structure. Although this special class of MESFET is used as an example embodiment of the present invention, it will be apparent to one of ordinary skill in the art that the present invention may be applicable to epitaxial devices in which a Schottky barrier is used to control current in a channel and the common substrate material to all such devices is GaAs. Significant reductions in the intensity of labor, processing time and an overall improvement in the uniformity across a given wafer may be realized by the utilization of $In_xGa_{1-x}P$, which is used as the etch-stop material in the devices of the present disclosure. To this end, a lower conduction band discontinuity between dissimilar materials translates to a lower resistance component of the overall access resistances. Reported experimental values for the conduction band discontinuity between $In_xGa_{1-x}P$ and GaAs vary between 30 and 220 meV, with the majority of the values falling between 180-220 meV.

Previous attempts with other materials such as AlAs, or more generally $Al_xGa_{1-x}As$, while exhibiting excellent selectivity to GaAs, result in increased access resistances as is discussed above. Accordingly, the increased access resistances have an adverse effect on parameters such as the maximum open channel current, knee voltage and transconductance. In contrast, the use of the $In_xGa_{1-x}P$ etch-stop in accordance with the present invention generally results in a lower conduction band discontinuity at the interface with the n-GaAs Schottky barrier layer and results in a lower tunneling barrier to current flow, and accordingly lower access resistances to the device. This enables the benefits of the etch-stop while maintaining the performance characteristics of devices fabricated without an etch-stop, which suffer the drawbacks of nonuniformity across a wafer. In one example, the etch-stop layers may be implemented with $In_{0.5}Ga_{0.5}P$. However, values of x other than 0.5 may be chosen to minimize the misfit dislocation density as described in, J. W. Matthews, A. E. Blakeslee, Defects in epitaxial multilayers I. Misfit dislocations, J. Crystal Growth, vol. 27, pp. 118-125, 1974, the disclosure of which is incorporated herein by reference. The range of permissible values of x may vary as a function of the thickness of the etch-stop layers.

Figure 1:
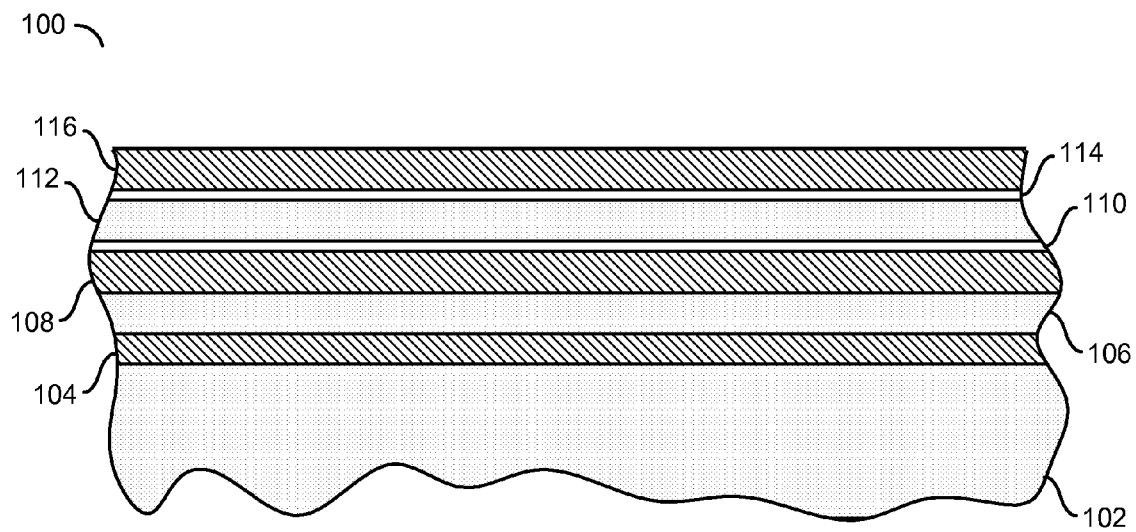
FIG. 1 is a diagram illustrating various layers of a semiconductor wafer prior to fabrication of a device in accordance with an example embodiment of the present invention.

Referring to FIG. 1, a diagram is shown illustrating a cross section 100 of a semiconductor wafer in accordance with an example embodiment of the present invention. The semiconductor wafer may comprise a layer 102, a layer 104, a layer 106, a layer 108, a layer 110, a layer 112, a layer 114 and a layer 116. The layer 102 may implement a semi-insulating GaAs substrate. The layer 104 may implement a buffer layer of unintentionally doped GaAs. The buffer layer 104 may be epitaxially disposed on the semi-insulating GaAs substrate 102. The layer 106 may implement a channel layer comprising an n-doped layer of GaAs. The layer 106 may be disposed on the layer 104. In one example, the channel layer 106 may have a doping level on the order of $3 \times 10^{17}$ cm$^{-3}$.

The layer 108 may implement a barrier layer. The barrier layer 108 may be disposed on top of the channel layer 106. The barrier layer 108 may comprise a layer of GaAs doped lightly n-type. In one example, the Schottky barrier layer 108 may have a doping level on the order of $5 \times 10^{16}$ cm$^{-3}$. The barrier layer 108 may have a thickness in the range of 200-1000 Angstroms. In a preferred embodiment, the thickness of the barrier layer 108 may be on the order of about 430 Angstroms. The distance between a gate metalization and the channel layer 106 is generally controlled (determined) by the thickness of the barrier layer 108, and thus the barrier layer 108 generally plays an important role in device parameters described herein.

The layer 110 may implement a first etch-stop layer. The layer 110 may be implemented, in one example, with $In_xGa_{1-x}P$. In another example, the first etch-stop layer 110 may comprise $In_xGa_{1-x}As_yP_{1-y}$. The first etch-stop layer 110 may have a thickness on the order of 10-50 Angstroms. The layer 112 generally implements a first contact layer. The layer 112 may comprise a continuation of the material in the underlying barrier layer 108 disposed on the first etch-stop layer 110. The layer 114 generally implements a second etch-stop layer deposited on the layer 112. The layer 116 generally implements a second contact layer. The layer 116 may comprise a highly doped material disposed on the layer 114. The layer 112 spatially separates a gate electrode stack from the highly doped contact layer 116 and, hence, maintains a reasonable breakdown voltage for the junction. The contact layer 116 is highly doped n+ to facilitate a good ohmic contact for the drain and source metallizations (described below in connection with FIG. 2). The barrier layer 106, on the other hand, is lightly doped to facilitate the formation of a good Schottky barrier. The gate-to-channel spacing may be chosen to realize, among other parameters, a specific pinch-off voltage Vp.

Figure 2:
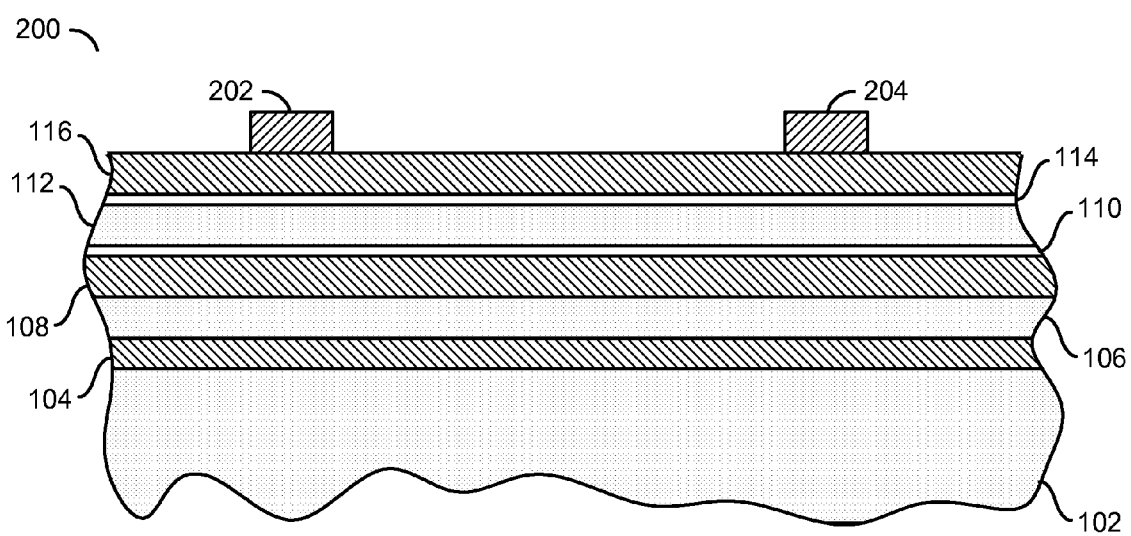
FIG. 2 is a diagram illustrating the semiconductor wafer after formation of source and drain ohmic contacts for the device.

Referring to FIG. 2, a diagram is shown illustrating a cross section 200 of the semiconductor wafer of FIG. 1 after ohmic contact formation. In general, ohmic contacts may be formed by defining areas lithographically, and then evaporating a suitable metal alloy (e.g., AuGeNiAu, etc.) followed by a subsequent lift off step to remove the photoresist layer and unwanted metallization. Such processing steps are well known to one of ordinary skill in the art. The final ohmic contacts may implement a contact 202 for the source and a contact 204 for the drain.

Figure 3:
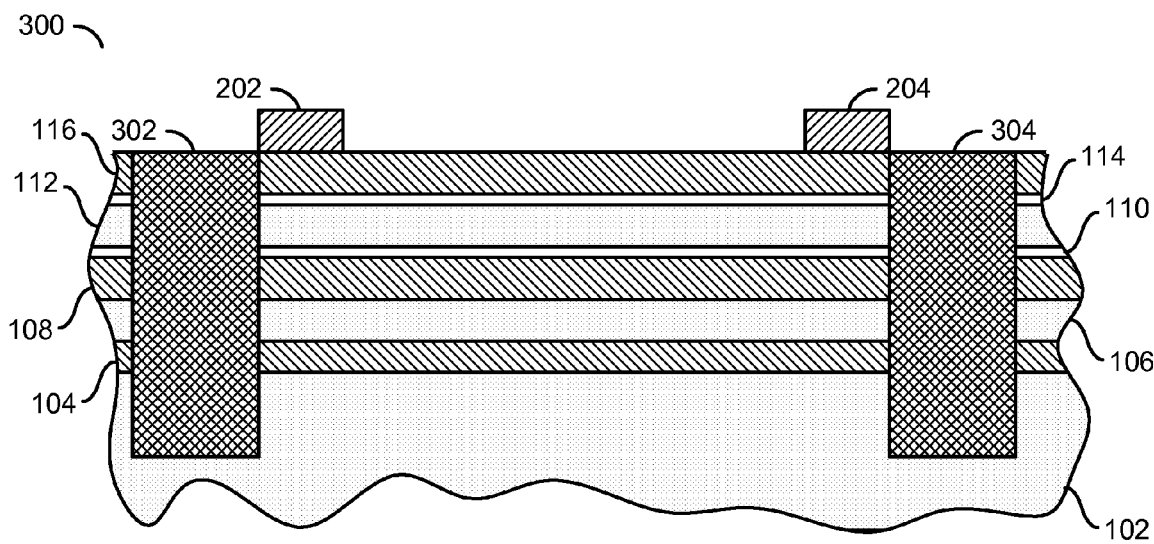
FIG. 3 is a diagram illustrating the semiconductor wafer after isolation implantation is performed in regions outside of the device lateral boundaries.

Referring to FIG. 3, a diagram is shown illustrating a cross section 300 of the semiconductor wafer of FIG. 2 after implant isolation is done. In order to properly isolate one device on the wafer from another device, isolation implantation may be performed in regions outside of the device lateral boundaries. Example isolation implantations 302 and 304 are shown generally. In one example, the regions which are outside the active semiconductor region may be rendered electrically inactive by implantation of a species such as Boron, a preferred implant material. Proton implantation (e.g., H$^+$) may also be employed. The implant profile generally extends into the semi-insulating GaAs substrate 102 and serves to properly isolate the device from other devices on the same die. An alternative to the above method, also well known to one of ordinary skill in the art, is to perform a mesa isolation, in which the layers of the device are disposed in mesa form by etching to remove the active material from all regions outside of the device boundaries.

Figure 4:
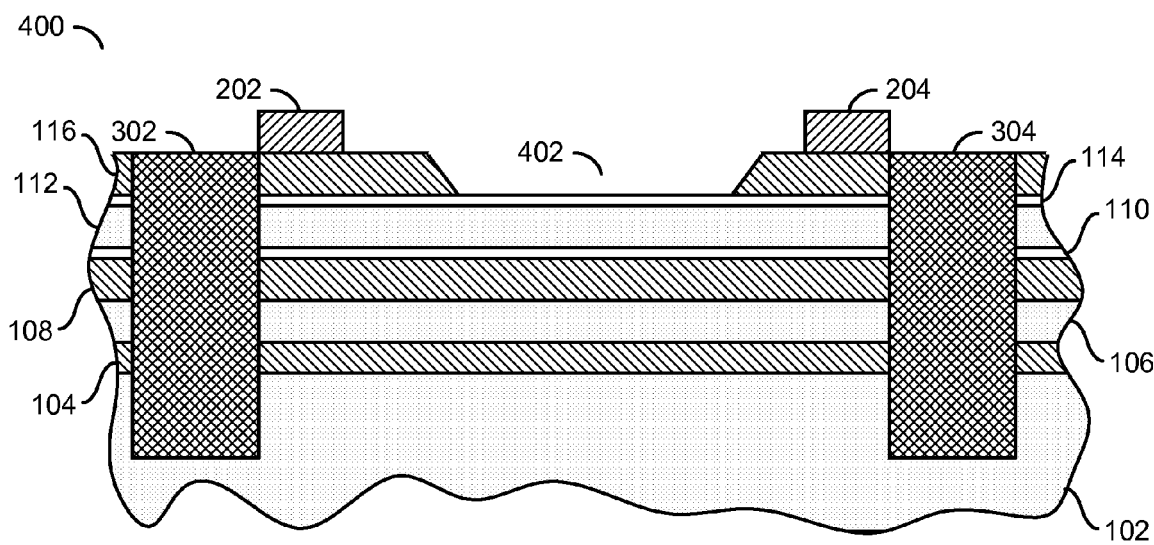
FIG. 4 is a diagram illustrating the semiconductor wafer after a first selective recess etch is performed to form a recess one region of the device.

Referring to FIG. 4, a diagram is shown illustrating a cross section 400 of the semiconductor wafer of FIG. 3 after performing a first selective recess etch to form a recess one region 402 of the device fabricated in accordance with an example embodiment of the present invention. The recess 402 may be defined, in one example, within an opening in a photolithographic film. The recess 402 may be etched to remove the highly doped contact layer 116. Etching may be performed using a first selective etch chemistry. With the etch-stop layer 114 inserted at the proper depth, a chemistry, which etches GaAs at a higher rate when compared to the $In_xGa_{1-x}P$ etch rate, may be used to form the recess 402. In one example, such a selective chemistry would be $H_2SO_4$: $H_2O_2$:$H_2O$ of volumetric ratio 1:8:500. For this composition of chemistry, the GaAs etch rate has been determined to be on the order of 10 Angstroms per second at room temperature and the ratio of GaAs to $In_{0.5}Ga_{0.5}P$ etch rates is on the order of 150.

While it is clear that the above chemistry is exemplary, other chemistries are clearly possible. The etch-stop material of the layer 114 generally ensures that the etching of the layer 116 proceeds at a much faster rate than that of the layer 114. By selecting the appropriate chemistry and thereby assuring an appropriate ratio of etch rates of the etch-stop layer 114 to that of the layer 116, a relatively uniform recess etch depth may be obtained across the wafer. Furthermore, the across-wafer uniformity of the recess one surface-to-channel dimension is now determined by the uniformity of the epitaxial layer 108.

Figure 5:
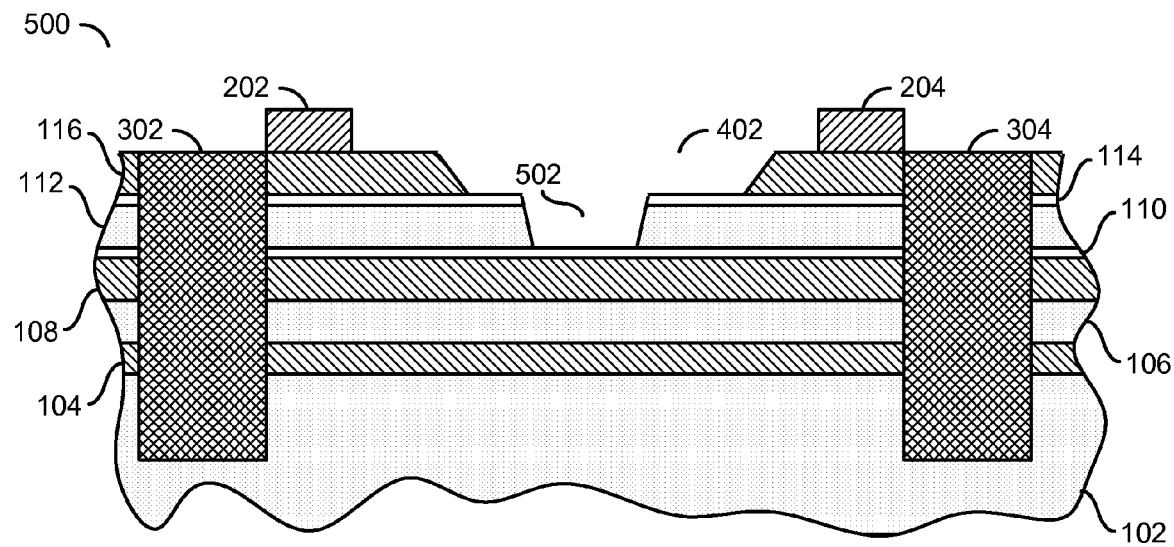
FIG. 5 is a diagram illustrating the semiconductor wafer after a second selective recess etch is performed to form the gate region of the device.

Referring to FIG. 5, a diagram is shown illustrating a cross section 500 of the semiconductor wafer of FIG. 4 after a second selective recess etch is performed to form gate region of the device fabricated in accordance with an example embodiment of the present invention. A recess 502 may be defined, in one example, within an opening in a photolithographic film (e.g., during a remasking step). The recess 502 may be etched to remove a selected portion of the etch-stop layer 114 and a portion of the contact layer 112 prior to the deposition of the gate electrode material. Etching may be performed by first using a second selective etch chemistry effective at removing the material of the etch-stop layer 114 while leaving the GaAs layer 116 generally unaffected, followed by an etch using the first selective etch chemistry to remove the appropriate portion of the contact layer 112. An improved selectivity may occur by the availability of etch chemistries that etch $In_xGa_{1-x}P$ at a finite rate but exhibit a relatively negligible etch rate for the underlying GaAs layer or effectively an infinite selectivity. By contrast, the best selectivity realized to date for GaAs over $In_xGa_{1-x}P$ have been limited to on the order of 150. An example of such a wet chemistry is the $HCl$:$H_3PO_4$:$H_2O$ system.

With the etch-stop 110 inserted at the proper depth, the chemistry, which etches GaAs at a higher rate when compared to the $In_xGa_{1-x}P$ etch rate, may be used to form the recess 502. In a preferred embodiment of the present invention, the selective chemistry of $H_2SO_4$:$H_2O_2$:$H_2O$ of volumetric ratio 1:8:500 may be used. However, other chemistries are clearly possible. The etch-stop material is generally selected to assure that the etching of the layers 112 and 116 proceed at a much faster rate than that of layers 110 and 114. By selecting the appropriate chemistry and thereby assuring an appropriate ratio of etch rates of the etch-stop layers 110 and 114 to that of layers 112 and 116, a relatively uniform recess etch depth may be obtained across the wafer. Furthermore, the across-wafer uniformity of the gate-to-channel dimension is generally determined by the uniformity of epitaxial layer 108.

Figure 6:
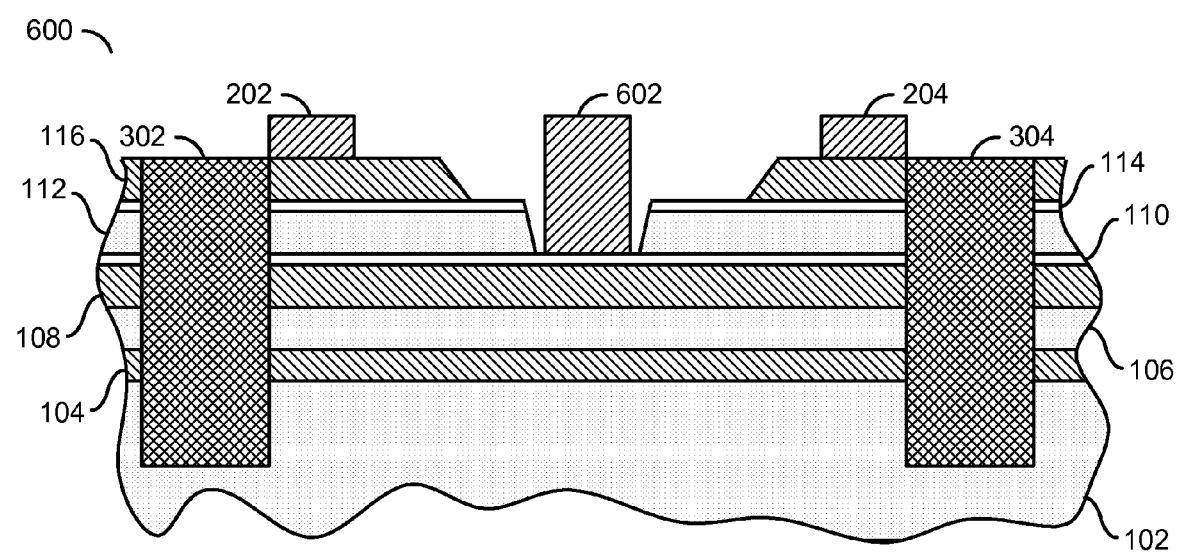
FIG. 6 is a diagram illustrating the semiconductor wafer after formation of a gate electrode of the device.

Referring to FIG. 6, a diagram is shown illustrating a cross section 600 of the semiconductor wafer of FIG. 5 after formation of a gate electrode of the device. After the etching of the layer 112 to the etch-stop layer 110 is complete, a gate electrode 602 may be fabricated through deposition techniques well known to one of ordinary skill in the art. Using the same lithographic layer used for recess definition, a Schottky contact may be deposited on the etch-stop layer 110 and the unwanted metallizations and photoresist lifted off. A typical gate electrode stack may comprise an alloy of titanium platinum gold (TiPtAu). Following formation of the gate electrode 602, the device may be passivated with a dielectric such as silicon nitride (SiN) and connected with other circuit elements via additional layers of metallization.

Figure 7:
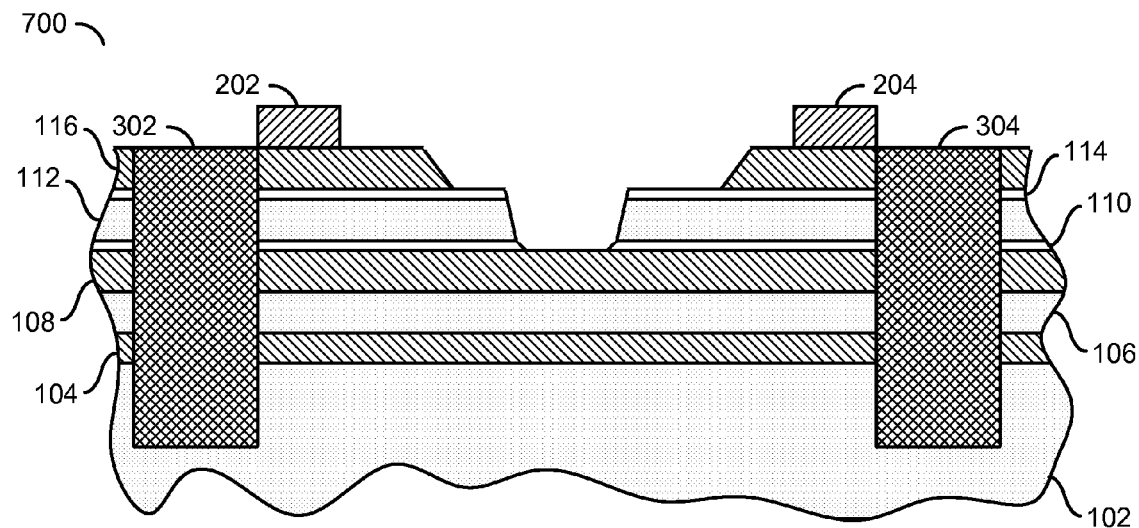
FIG. 7 is a diagram illustrating an alternative embodiment in which an etch-stop layer at a base of the gate region is removed prior to formation of the gate electrode.

Referring to FIG. 7, a diagram is shown illustrating a cross section 700 of the semiconductor wafer of FIG. 5 following an optional etching step. In one example, the proportion of the etch-stop layer 110 exposed by the lithographic film used for definition of the recess 502 may be selectively removed to reveal the underlying layer 108 prior to gate electrode deposition (illustrated by the cross section 800 in FIG. 8). An example of a wet etch chemistry which exhibits a high $In_{0.5}Ga_{0.5}P$ etch rate to be on the order of 1 micron per min, where as no discernable GaAs etch rate has been observed in HCl. Hence the selectivity ratio is virtually infinite.

Two etch-stop thicknesses, 10 and 20 Angstroms, have been utilized, although other thicknesses in keeping with the teaching of the present invention may be used. Using a 20 Angstrom $In_xGa_{1-x}P$ layer as the etch-stop layer 110, the following wafer average MESFET device parameters have been realized. $I_{max}$ of 400 mA/mm compares well to a wafer fabricated through conventional techniques. Additionally, a pinch-off voltage of −1.78 volts compares well to conventionally fabricated devices. The intrinsic transconductance of devices fabricated by the technique of the present disclosure with a 20 Angstrom etch-stop layer is on the order of 156 mS/mm is again comparable to a device fabricated by conventional techniques without an etch-stop layer. Finally, the sum of the source and drain resistances show no significant difference to devices fabricated without an etch-stop. Clearly, this is in sharp contrast to devices fabricated with epitaxy employing other materials for the etch-stop layer for which access resistances are as discussed above. It has been found that even the use of exceedingly thin layers of AlAs, on the order of 10 Angstroms thick, have resulted in an increase in the combined source and drain resistances of more than 40% relative control samples containing no such stop layer.

A process figure of merit known as contact resistance has also been compared for two thicknesses of AlAs (10 and 25 Angstroms) and two thicknesses of $In_{0.5}Ga_{0.5}P$ etch stops (10 and 20 Angstroms) with samples containing no etch stop layers. The AlAs samples exhibited 0.3 and 0.8 Ohm-mm for the 10 and 25 Angstrom case respectively as compared with 0.1 Ohm-mm for the control samples. The difference in value is attributable to a reduction in electron tunneling probability associated with the relatively large conduction band discontinuity at the AlAs/GaAs interfaces. For the $In_{0.5}Ga_{4.5}P$ case, no significant difference was observed between samples, including the control samples, with all exhibiting contact resistances on the order of 0.15 Ohm-mm. The latter experiment suggests that $In_{0.5}Ga_{0.5}P$ etch stop layers as thick as 20 Angstroms do not present an additional parasitic resistive element when compared to the parasitic resistive elements of the control sample devices which do not use the etch stop layer of the present invention.

A significant benefit of the present invention is that the InGaP etch stop material that remains on the recess one surface generally results in a surface with relatively low interface recombination velocity. This has the benefit of reducing the 1/f noise or phase noise of the device. An additional benefit of the dual etch stop modification is an improvement in the overall reproducibility of power performance of the FET process. During the manufacture of double recess transistors without recess one etch stop layers inserted, over etch of the material may occur and may result in a degradation of the power, efficiency and noise performance of the device. With insertion of the recess one etch stop, control of the first recess depth may be maintained within several mono-layers across wafer and process. The preferred material for both etch stops is InGaP due to the favorable conduction band alignment of InGaP with underlying GaAs and AlGaAs, wherein the energetic barrier in the conduction band on the structure is maintained at a relatively low value and results in no substantial degradation of the access resistance to the channel.

Figure 8:
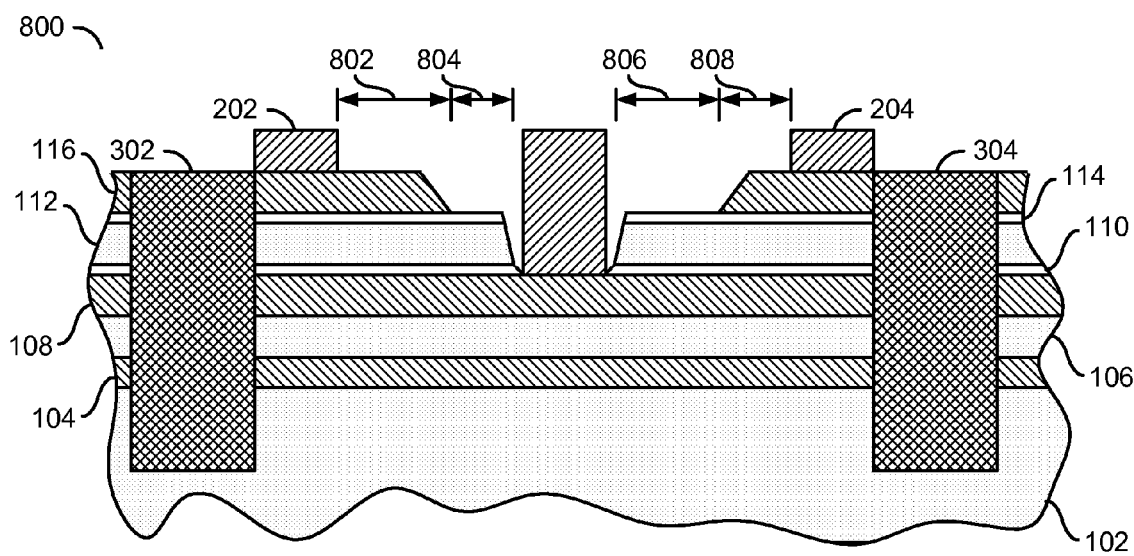
FIG. 8 is a diagram illustrating the semiconductor wafer of FIG. 7 after formation of the gate electrode of the device.

Referring to FIG. 8, a diagram is shown illustrating a cross section 800 of a semiconductor wafer similar to that of FIG. 7 after deposition of the gate electrode. In one example, a surface of the layer 116 between the source electrode 202 and the gate electrode may have a dimension 802, an exposed recess one surface of the layer 114 between the source electrode 202 and the gate electrode may have a dimension 804, an exposed recess one surface of the layer 114 between the gate electrode and the drain electrode 204 may have a dimension 806, and a surface of the layer 116 between the gate electrode and the drain electrode 204 may have a dimension 808. The dimensions 802 and 808 may be similar or different. The dimensions 804 and 806 may be similar or different.

Figure 9:
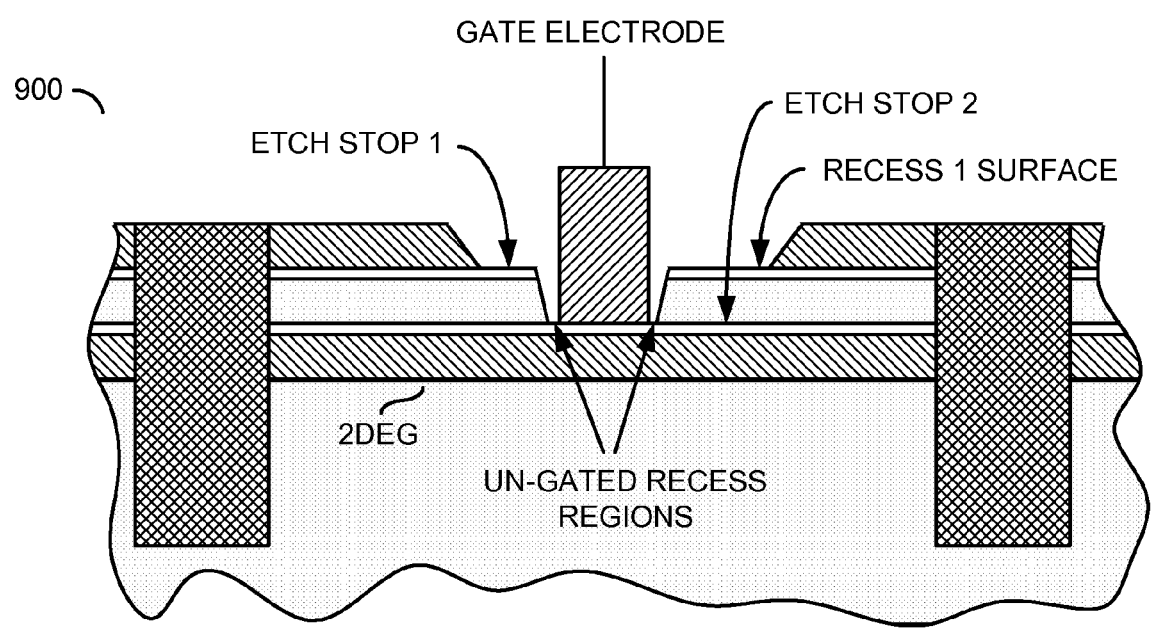
FIG. 9 is a diagram illustrating an example device in accordance with an embodiment of the present invention.

Referring to FIG. 9, a diagram is shown illustrating an alternative view of a cross section 900 of a device in accordance with an example embodiment of the present invention. A common approach in the realization of pHEMT power devices is the use of a double recess structure to simultaneously realize 1) low access resistance, 2) high breakdown voltage, and 3) high power and efficiency. If the surface of the first recess is etched too deep relative to the top surface (e.g., if the recess one surface is too close to the conduction channel), the surface potential and surface potential variability may substantially degrade the modulation efficiency and hence the drain efficiency of the device. Additionally, it is important to maintain dimensional control of recess two such that the amount of un-gated recess surface (e.g., the recess two surface not directly covered by the gate electrode) is kept to a minimum and controlled. If the dimension of recess 2 becomes too large, higher breakdown voltage is realized, but at the expense of drain efficiency.

In one example, the present invention may implement a modification of the epitaxial design to incorporate two separate etch stop layers; one at the first recess terminus and another at the second recess terminus. In a preferred embodiment, the etch stop layers may comprise InGaP. The InGaP material is generally preferred for 1) its favorable conduction band alignment to GaAs and AlGaAs material, which results in minimal increase in access resistance to the channel, and 2) a low interface recombination velocity which results in a lessening of surface potential variation. The material associated with the top etch stop layer (etch stop 1 in FIG. 9) may be left behind unetched on top of the recess one surface. Leaving the etch stop material behind improves noise and dispersion characteristics due to the low IRV and may reduce the amount of undercut of the second recess etch profile reducing variation in the un-gated region dimensions.

Figure 10:
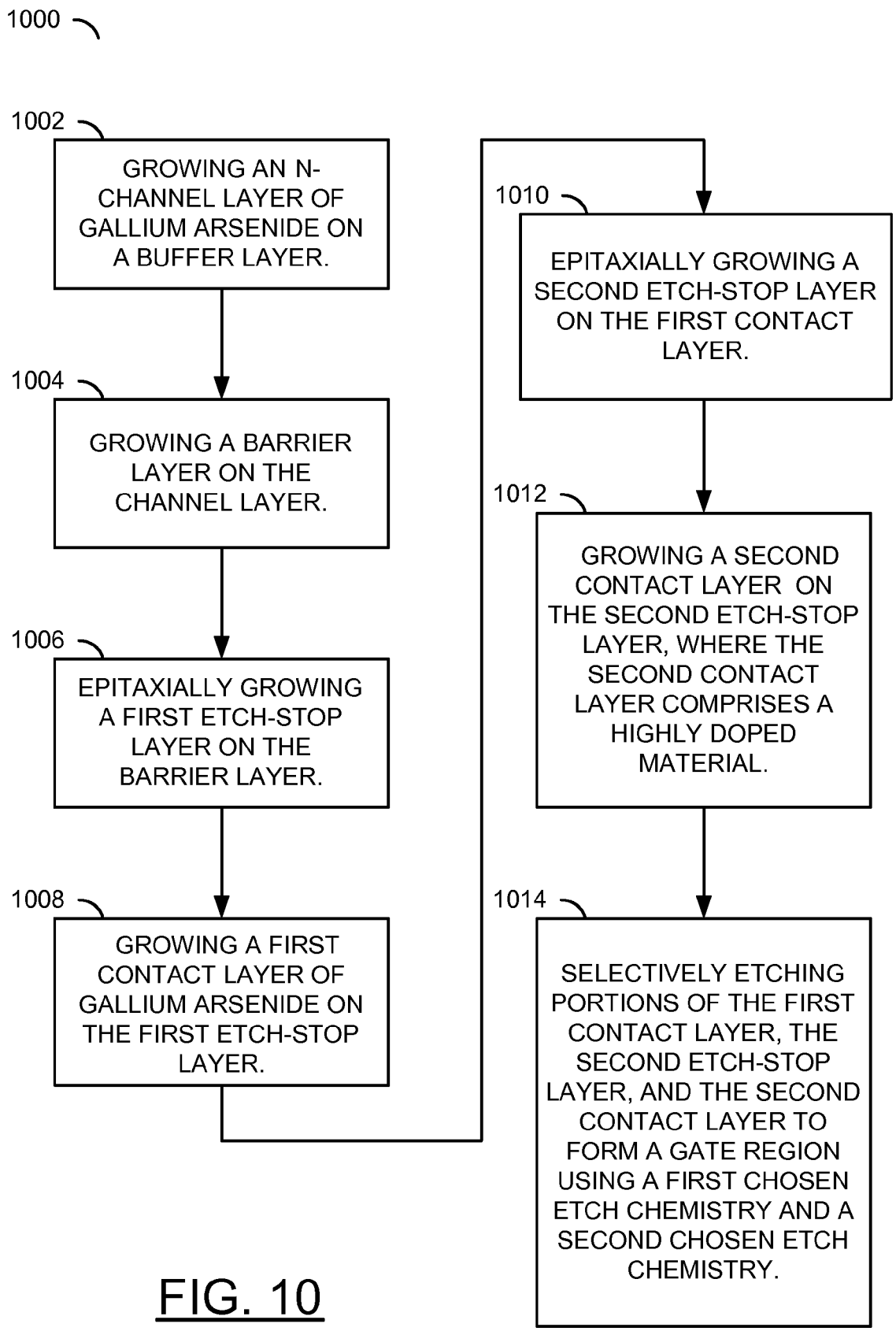
FIG. 10 is flow diagram illustrating a process in accordance with an example embodiment of the present invention.

Referring to FIG. 10, a flow diagram is shown illustrating an example process 1000 in accordance with an example embodiment of the present invention. In one example, the process (or method) 1000 may comprise a step 1002, a step 1004, a step 1006, a step 1008, a step 1010, a step 1012, and a step 1014. The step 1002 may comprise growing an n-channel layer of low band-gap material (e.g., InGaAs) on a buffer layer. The step 1004 may comprise growing a barrier layer on the channel layer. The step 1006 may comprise epitaxially growing a first etch-stop layer on the barrier layer. The step 1008 may comprise growing a first contact layer comprising a wide band-gap material (e.g., AlGaAs) on the first etch-stop layer. The wide band-gap material generally has a band-gap value that is greater than or equal to the band-gap value of the n-channel layer grown in the step 1002. The step 1010 may comprise epitaxially growing a second etch-stop layer on the first contact layer. The step 1012 may comprise growing a second contact layer on the second etch-stop layer, where the second contact layer generally comprises a highly doped material (e.g., AlGaAs). The step 1014 may comprise selectively etching portions of the first contact layer, the second etch-stop layer, and the second contact layer to form a gate region. The step 1014 may include masking and/or remasking steps. For example, the portion of the first contact layer may be removed following a first masking step and the removal of the portion of the second etch-stop layer may follow a second masking step. The first and the second contact layers may be etched using a chosen first etch chemistry. The second etch-stop layer may be etched using a chosen second etch chemistry.

While the invention has been particularly shown and described with reference to the preferred embodiments thereof, it will be understood by those skilled in the art that various changes in form and details may be made without departing from the scope of the invention.

The invention claimed is:

1. A process for fabricating a semiconductor device, the process comprising:
    growing an n-channel layer of gallium arsenide (GaAs) on a buffer layer;
    growing a barrier layer on said channel layer;
    epitaxially growing a first etch-stop layer on said barrier layer;
    growing a first contact layer comprising a wide band-gap material on said first etch-stop layer;
    epitaxially growing a second etch-stop layer on said first contact layer;
    growing a second contact layer on said second etch-stop layer, said second contact layer comprising a highly doped material; and
    selectively etching portions of said first contact layer, said second etch-stop layer, and said second contact layer to form a gate region, wherein (i) said first and said second contact layers have a first etch rate and said first and said second etch-stop layers have a second etch rate in a chosen first etch chemistry, (ii) said first and said second contact layers have a third etch rate and said first and said second etch-stop layers have a fourth etch rate in a chosen second etch chemistry, (iii) said first etch rate is larger than said second etch rate, and (iv) said fourth etch rate is larger than said third etch rate.

2. The process according to claim 1, wherein said first contact layer comprises Aluminum Gallium Arsenide (AlGaAs).

3. The process according to claim 1, wherein said second contact layer comprises Gallium Arsenide (GaAs).

4. The process according to claim 1, wherein a ratio of said first etch rate to said second etch rate is on the order of about 150.

5. The process according to claim 1, wherein said first and said second etch-stop layers comprise $In_xGa_{1-x}P$, where x varies as a function of the thickness of said etch-stop layer.

6. The process according to claim 5, wherein x is greater than or equal to 0.4 and less than or equal to 0.6.

7. The process according to claim 1, wherein said first and said second etch-stop layers comprise $In_xGa_{1-x}As_yP_{1-y}$.

8. The process according to claim 1, wherein said first etch chemistry is $H_2SO_4:H_2O_2:H_2O$.

9. The process according to claim 1, further comprising depositing a gate metal layer in said gate region.

10. The process according to claim 1, wherein said first and said second etch-stop layers have a thickness on the order of 10-50 Angstroms.

11. The process according to claim 1, further comprising:
opening a window in said first etch-stop layer via said second etch chemistry; and
depositing a gate metal layer therein, said gate metal making electrical contact with said barrier layer.

12. The process according to claim 1, wherein said second etch chemistry is $HCl:H_3PO_4:H_2O$.

13. A process for fabricating a field-effect transistor, the process comprising:
growing an epitaxial buffer layer of unintentionally doped gallium arsenide (GaAs) on a GaAs substrate;
growing an epitaxial n-channel layer on said buffer layer;
growing a Schottky layer on said n-channel layer;
growing a first etch-stop layer of $In_xGa_{1-x}P$ on said n-channel layer;
growing a first contact layer on said first etch-stop layer;
growing a second etch-stop layer of $In_xGa_{1-x}P$ on said first contact layer;
growing a second contact layer on said second etch-stop layer; and
selectively etching said first contact layer, said second etch-stop layer, and said second contact layer to form a double recess in said first and said second contact layers, said selective etching effected with a first etch chemistry and a second etch chemistry, said first etch chemistry etching said first and said second contact layers at a rate substantially faster than said first etch chemistry etches said second etch-stop layer, said second etch chemistry etching said second etch-stop layer at a rate substantially faster than said second etch chemistry etches said first and said second contact layers.

14. The process according to claim 13, wherein said first etch chemistry etches said first and said second contact layers at a rate on the order of 150 times faster than said first etch chemistry etches said second etch-stop layer.

15. The process according to claim 13, wherein x is greater than or equal to 0.4 and less than or equal to 0.6.

16. The process according to claim 13, wherein said first etch chemistry is $H_2SO_4:H_2O_2:H_2O$.

17. The process according to claim 13, wherein a gate metal layer is deposited in said recess.

18. The process according to claim 13, wherein said first and said second etch-stop layers have a thickness on the order of 10-50 Angstroms.

19. The process according to claim 13, further comprising opening a window in said first etch-stop layer via said second etch chemistry and depositing a gate metal layer therein, said gate metal making electrical contact with said barrier layer.

20. The process according to claim 13, wherein said second etch chemistry is $HCl:H_3PO_4:H_2O$.

* * * * *